(12) United States Patent
Inaba et al.

(10) Patent No.: US 6,796,795 B2
(45) Date of Patent: Sep. 28, 2004

(54) METHOD AND APPARATUS FOR LOADING SUBSTRATE IN SEMICONDUCTOR MANUFACTURING APPARATUS

(75) Inventors: Shinichi Inaba, Hachioji (JP); Yosuke Ide, Yamanashi-ken (JP)

(73) Assignee: Anelva Corporation, Tokyo (JP)

( * ) Notice: Subject to any disclaimer, the term of this patent is extended or adjusted under 35 U.S.C. 154(b) by 456 days.

(21) Appl. No.: 09/797,702

(22) Filed: Mar. 5, 2001

(65) Prior Publication Data

US 2001/0019741 A1 Sep. 6, 2001

(30) Foreign Application Priority Data

Mar. 6, 2000 (JP) ........................................ 2000-061263

(51) Int. Cl.[7] .............................................. F27D 5/00
(52) U.S. Cl. ............................ 432/5; 219/390; 118/725
(58) Field of Search ........................... 432/5, 122, 124, 432/4; 219/390, 405; 392/416, 418; 118/715, 725–728; 414/935, 939; 438/660, 680

(56) References Cited

U.S. PATENT DOCUMENTS 6,169,032 B1 * 1/2001 Murakami et al. .......... 438/683
6,276,072 B1 * 8/2001 Morad et al. .................. 34/428
6,394,797 B1 * 5/2002 Sugaya et al. ............... 432/253

* cited by examiner

Primary Examiner—Gregory Wilson
(74) Attorney, Agent, or Firm—Oliff & Berridge, PLC (57) ABSTRACT

A method and apparatus for loading a substrate is applied to a semiconductor manufacturing apparatus in which a substrate is carried in a vacuum-processing chamber, and loaded on a heated processing table, and further is applied with predetermined processing in a cold-wall processing mode. In the method, for example, the substrate is temporarily stopped before being loaded on the processing table. By the temporal stop, the temperature difference between the substrate and the processing table becomes smaller. When the temperature difference becomes smaller, even if the substrate expands due to heat from the processing table, the degree of the change becomes smaller and therefore it is possible to reduce peeling of films deposited on the substrate-loading surface of the processing table.

15 Claims, 6 Drawing Sheets

RELATED ART

FIG. 10

METHOD AND APPARATUS FOR LOADING SUBSTRATE IN SEMICONDUCTOR MANUFACTURING APPARATUS

BACKGROUND OF THE INVENTION

1. Field of the Invention

The present invention relates to a method and apparatus for loading a substrate in a semiconductor manufacturing apparatus. More particularly, it relates to a method and apparatus for loading a substrate on a substrate-loading section so that a temperature difference between the substrate and the section becomes smaller in a vacuum-processing chamber.

2. Description of the Related Art

Conventionally, a sputtering apparatus for depositing a thin film on a substrate, a chemical vapor deposition (CVD) apparatus, an etching apparatus for etching a thin film deposited on a substrate using plasma and the like have been well-known. They are semiconductor manufacturing apparatuses for processing a substrate carried into a vacuum processing chamber. In these semiconductor manufacturing apparatuses, films are deposited or films are etched, so it is widely known that originally undesirable films or etching products from the substrate deposit on a processing table loading the substrate.

Figure 9:
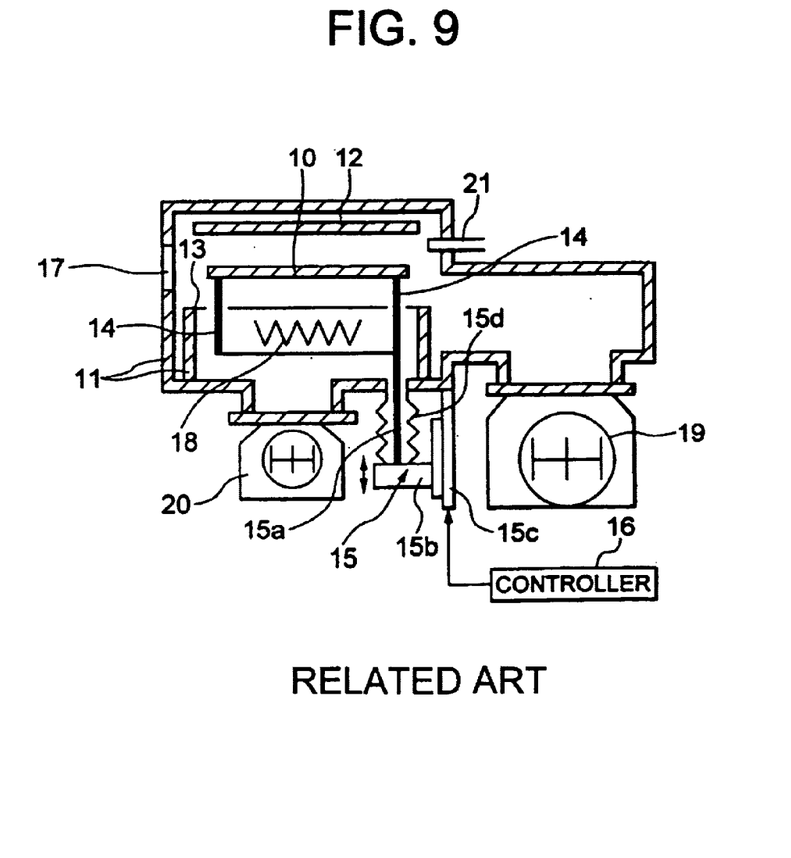
FIG. 9 is a longitudinal sectional view of a semiconductor manufacturing apparatus to which the conventional method of loading a substrate.

Next an example of the conventional CVD apparatus will be explained referring to FIG. 9. This CVD apparatus is a cold-wall type vacuum processing apparatus heating only the substrate to be processed. In this CVD apparatus, the vacuum-processing chamber is comprised of a water-cooled chamber 11. The vacuum-processing chamber is provided with a heat reflecting plate 12 and a processing table 13 housing a heating source. The vacuum-processing chamber is structured so that only the substrate to be processed is heated. The processing table 13 is a substrate holder with a top surface serving as a substrate-loading surface. The processing table 13 is provided with three lift pins 14 arranged in a vertically movable structure, for example. A lift pin drive mechanism 15 for raising and lowering the lift pins 14 and a controller 16 for controlling the operation of the lift pin drive mechanism 15 are provided with respect to the lift pins 14. The lift pin drive mechanism 15 is comprised of a support 15a linked with the plurality of lift pins 14, a movable member 15b supporting the support 15a, and a drive member 15c raising and lowering the movable member 15b. The support 15a is arranged passing through the bottom of the vacuum-processing chamber, so the support 15a is covered by a bellows 15d so as to maintain the vacuum seal of the vacuum-processing chamber and deal with the operation of raising and lowering the support 15a. A substrate 10 to be processed is carried into the vacuum-processing chamber by a transport robot (not shown) through a transport gate 17 and is first placed on the raised lift pins 15. Next, the lift pins 14 are made to descend, whereby the substrate 10 is loaded on the substrate-loading surface of the processing table 13. The processing table 13 houses a heater 18 and is heated to a fixed temperature of 600° C., for example. Illustration of the mechanism for supplying power to the heater 18, and the control mechanism for measuring the temperature of the heater 18 using a thermocouple and controlling the amount of power supplied by the power supply mechanism are omitted. Note that the above vacuum-processing chamber is provided with turbo molecular pumps 19 and 20, for example, at a side-wall and bottom for evacuating the inside thereof to a required vacuum state. The inside of the vacuum-processing chamber is divided into a top chamber positioned above the processing table 13 and a bottom chamber positioned below it. The turbo molecular pumps 19 and 20 are used to evacuate the top chamber and bottom chamber to the required pressure, respectively.

After the substrate 10 is loaded on the substrate-loading surface of the processing table 13, a heat stabilization time of 180 seconds is waited for allowing the temperature of the substrate 10 to approach the temperature of the processing table 13 and stabilize, then a heat decomposing gas, $Si_2H_6$ gas, is introduced from a gas nozzle 21 at a rate of 12 sccm, for example. Due to this, Si films are deposited on the heated substrate 10. The temperature of the inside-walls of the vacuum-processing chamber is adjusted by water circulating in the water-cooled chamber 11 to become about the water temperature, so the $Si_2H_6$ gas does not decompose at the walls and consequently no silicon films are deposited. On the other hand, since the processing table 13 is heated to 600° C. by the heater 18, silicon films are deposited at this portion. The silicon films deposited on the processing table 13 increase in thickness along with the number of substrates 10 processed.

In the above conventional CVD apparatus, experience has shown that the silicon films increased in thickness along with the number of substrates processed are subject to heat stress produced by the heat expansion of the substrate and easily peel off from the deposited surface.

Figure 10:
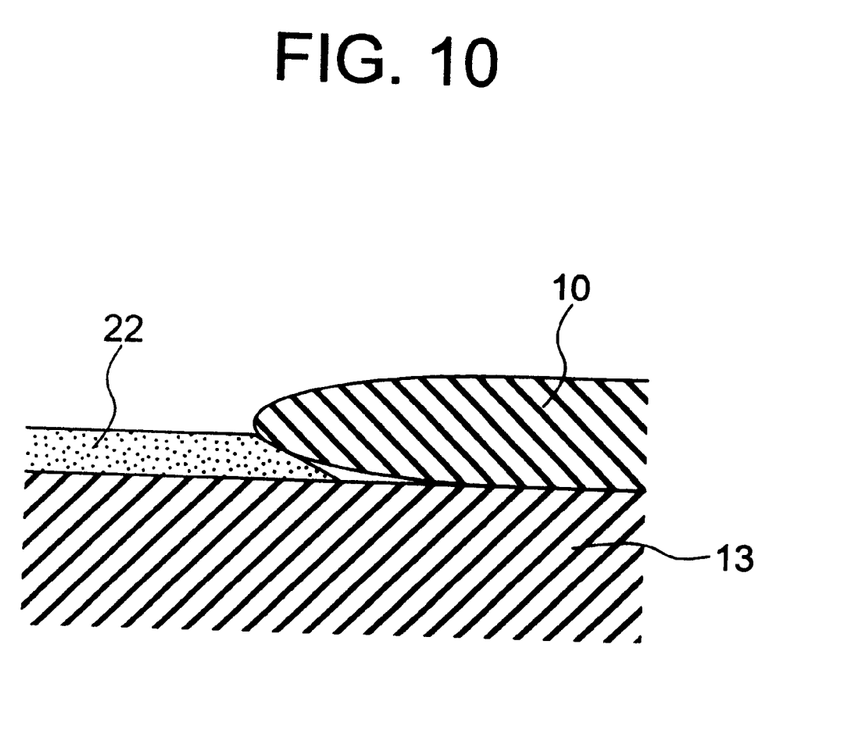
FIG. 10 is a longitudinal sectional view for explaining the relationship between a substrate and deposited film at the substrate-loading surface of the processing table.

Referring to FIG. 10, the action of the peeling of the silicon films due to the heat expansion of the substrate will be explained. As explained above, the processing table 13 is heated to 600° C. by the heater 18. As opposed to this, the substrate 10 carried into the vacuum-processing chamber by the transport robot and loaded on the processing table 13 is placed on the substrate-loading surface of the processing table at a relatively low temperature compared with the processing table 13. A silicon film 22 is deposited on the processing table 13 and at the outer circumference of the substrate 10. The substrate 10 in this state is heated by the heat from the processing table 13 and rises in temperature too close to the temperature of the processing table 13.

Here, an explanation will be given of the case where the substrate 10 is at room temperature when loaded in the vacuum-processing chamber. The heat from the processing table 13 rapidly heats the substrate 10 loaded on the processing table 13. When the substrate to be processed is a silicon substrate, and if it has a diameter of 200 mm and a thermal expansion coefficient of $4.1 \times 10^{-6}$/° C., while being heated from room temperature 25° C. to 600° C., the substrate expands by exactly 200 (mm)×$4.1 \times 10^{-6}$ (1/° C.)× (600−25) (° C.)=0.47 (mm). At this time, the substrate 10 slides on the substrate-loading surface of the processing table 13, so force is applied to the silicon film 22 deposited on the processing table 13 and peeling is promoted.

The silicon film peeled off due to this action scatters over the substrate as foreign particle and causes originally undesirable defects in the substrate.

Therefore, to prevent this peeling, in the past, the practice had been to allow the temperature of the processing table 13 to sufficiently fall, load the substrate 10, then allow sufficient time to heat it to a predetermined temperature.

With this method, however, a large amount of time was required until the substrate 10 reaches the predetermined temperature and therefore the productivity was remarkably reduced.

The above-mentioned problem also arises in a case that the temperature of the substrate is relatively high compared with the processing table being in a cooled state (or a low temperature state).

SUMMARY OF THE INVENTION

An object of the present invention is to provide a method and apparatus for loading a substrate in a semiconductor manufacturing apparatus designed to load the substrate on a heated or cooled processing table in a manner by which the temperature difference between the processing table and the substrate becomes smaller so as to prevent peeling of thin films deposited on the processing table.

The method and apparatus for loading a substrate in a semiconductor manufacturing apparatus according to the present invention are comprised as follows to achieve the above object.

The method of loading a substrate according to the present invention is applied to a semiconductor manufacturing apparatus in which a substrate is carried into a vacuum-processing chamber, loaded on a heated or cooled processing table, and then is processed by predetermined processing in a cold-wall type vacuum processing mode. According to the method of loading a substrate, sufficient time is allowed to elapse before loading the substrate on the processing table so that the temperature difference between the processing table and the substrate at the time of lowering the substrate to load it becomes less than a predetermined temperature. As the method for allowing sufficient time to elapse, it is possible to temporarily stop the substrate. By temporarily stopping it in this way, the temperature difference between the substrate and the processing table is made smaller. When the temperature difference between the substrate and processing table becomes smaller and less than a predetermined temperature, for example, less than 150° C. in the case of heating, even if the substrate expands due to heat from the processing table, the extent of the change becomes smaller and the peeling of films deposited on the substrate-loading surface of the processing table can be reduced.

The method of loading a substrate according to the present invention has more specific features as follows in the semiconductor manufacturing apparatus having the above configuration. That is, the semiconductor processing apparatus is provided with lift pins for loading the substrate on the processing table and a drive mechanism for raising and lowering the lift pins. In the method of loading a substrate, the substrate carried into the vacuum-processing chamber is placed on the lift pins and the lift pins are made to descend for loading the substrate on the processing table. The substrate carried into the vacuum-processing chamber by a transport robot is transported above the lift pins moved to an ascended position. When the lift pins are made to descend, sufficient time is allowed to elapse so that the temperature difference between the processing table and the substrate at the time required for loading the substrate becomes less than a predetermined temperature, and then the substrate is loaded on the processing table. For example, the substrate may be made to temporarily stop in the middle of its descent so as to make the temperature difference between the substrate and the processing table smaller than a predetermined level.

In the above method of loading a substrate, preferably the substrate is made to temporarily stop during its descent. Further, preferably, when making the lift pins descend and temporarily stopping the descent above the processing table, the position is in the range of 1 to 50 mm above the table. More preferably, in the method of loading a substrate, the substrate is made to descend at a fixed rate of descent and the descent time is in the range of 1 to 360 seconds. Further, in the method of loading a substrate, preferably, when the substrate is a silicon substrate before processing, the descent time is in the range of 60 to 180 seconds. When the substrate is an actual device substrate the descent time is in the range of 1 to 180 seconds. Further, the descent operation of the lift pins is preferably divided into at least two stages.

The method of loading a substrate according to the present invention is characterized by controlling the substrate-loading method so that the temperature difference between the substrate and processing table becomes less than a predetermined temperature when loading the substrate on the processing table. When the processing table is heated, for example, the temperature difference is preferably less than 150° C. from the viewpoint of effectively preventing peeling of silicon films deposited on the substrate-loading surface.

Next, an apparatus for loading a substrate (or a substrate loader) according to the present invention is applied to a semiconductor manufacturing apparatus. In this semiconductor manufacturing apparatus, a substrate is carried into a vacuum-processing chamber, and loaded on a heated or cooled processing table installed in the vacuum-processing chamber, and is applied with predetermined processing. It is provided with lift pins for loading the substrate on the processing table and a drive mechanism for raising and lowering the lift pins. The substrate loader is provided with a first thermometer for measuring the temperature of the substrate, a second thermometer for measuring the temperature of the processing table, and a controller. The controller receives the signals outputted from the first thermometer and second thermometer, and controls the operation of the drive mechanism based on the temperature information of the substrate and the processing table. Thereby, the controller causes sufficient time to elapse when lowering the lift pins so that the temperature difference between the processing table and the substrate at the time of loading the substrate becomes less than a predetermined temperature, and then load the substrate on the processing table. The predetermined temperature is preferably 150° C. when the processing table is heated.

Next, an explanation will be made about the process leading up to the idea of the method and apparatus described above.

Figure 5:
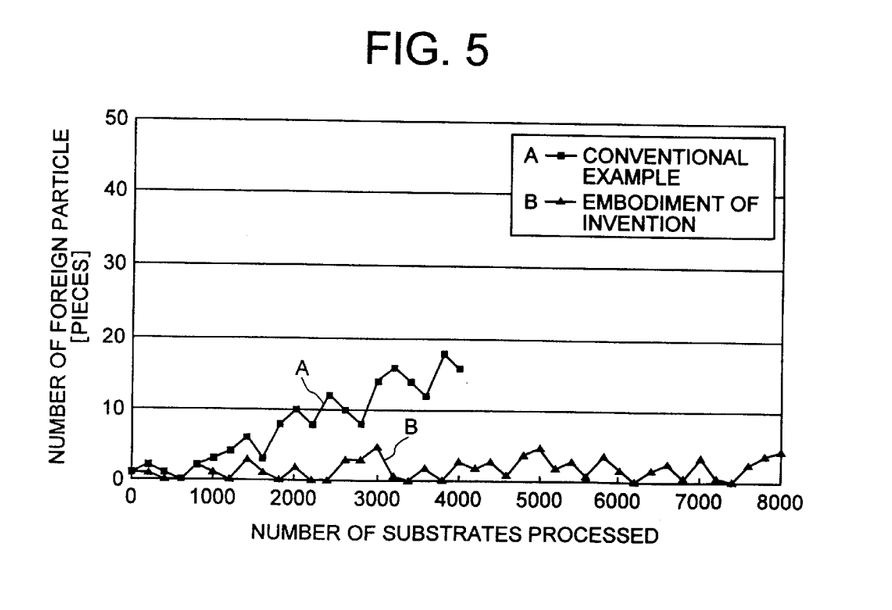
FIG. 5 is a graph of the change in the occurrence of foreign particle in accordance with the number of substrates processed by the method of loading a substrate according to the present invention and the conventional method of loading a substrate.

FIG. 5 shows the results of measurement of the number of pieces of foreign particle when repeatedly processing substrates. In FIG. 5, the abscissa indicates the number of substrates processed and the ordinate the number of pieces of foreign particle. In the case of the conventional method of loading a substrate (graph A), it is learned that the number of pieces of foreign particle exceeds 10 when over 2000 substrates are processed. Therefore, the present inventors analyzed the above phenomenon resulting from the conventional method by measuring the number of pieces of foreign particle when changing the temperature of the substrate carried into the vacuum-processing chamber and changing the time until loading the substrate on the processing table.

Figure 6:
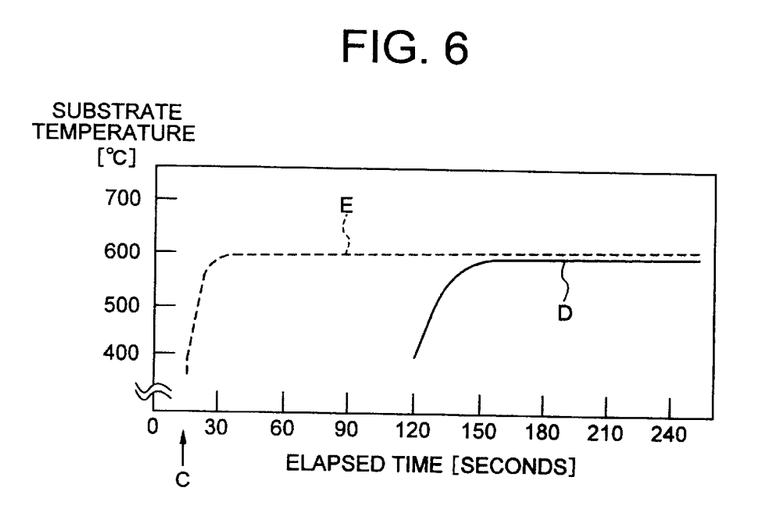
FIG. 6 is a view of the state of change of the substrate temperature when a substrate is loaded on a processing table.

FIG. 6 shows the results of measurement of the change in temperature of the substrate (silicon bare substrate), after being carried into the vacuum-processing chamber, using a radiant-energy thermometer. In FIG. 6, the abscissa indicates the time elapsed from placing the substrate on the lift pins, while the ordinate indicates the temperature of the substrate measured using the radiant-energy thermometer. Here, the time shown by the symbol C in FIG. 6 is the time at which the substrate is loaded on the processing table. In FIG. 6, the graph D shows the change in temperature in the case of a silicon bare substrate (silicon substrate before processing), while the graph E shows the change in temperature in the case of an actual device substrate (substrate before processing other than silicon or processed silicon substrate). From FIG. 6, it is learned that the temperature of the substrate 10 is not more than 400° C. at the time C when the substrate is loaded on the processing table. In the graph D, the temperature exceeded 400° C. in about 120 seconds and stabilized at about 180 seconds. In the graph E, the temperature rose about 5 seconds after loading. The range of measurement of the radiant-energy thermometer (optical pyrometer etc.) used here is from 400° C. to 700° C. A temperature of not more than 400° C. cannot be measured. Note that the characteristic shown by the graph D in FIG. 6 changes according to the thickness of the films deposited on the substrate. For example, if the film becomes thick, sometimes about 360 seconds is required until a stable state is reached.

Figure 7:
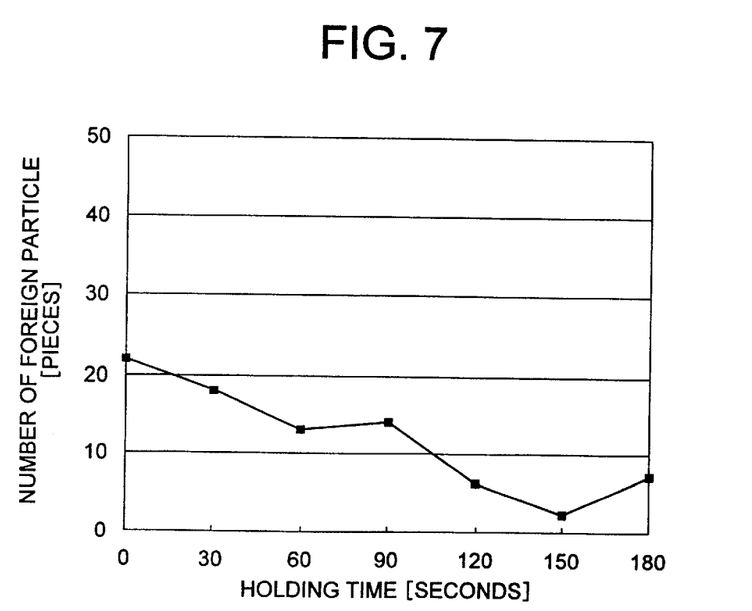
FIG. 7 is a graph of the relationship between a holding time and the number of foreign particle generated.

FIG. 7 shows the results of measurement of the number of pieces of foreign particle when changing the time from when a substrate is placed on the lift pins to when it is loaded on the processing table after a sufficient silicon film is deposited on the processing table after repeated processing of substrates. The time until loading the substrate on the processing table was changed by stopping the descent of the lift pins at a position close to the processing table. In FIG. 7, the abscissa indicates the holding time showing the time until loading, while the ordinate shows the number of pieces of foreign particle. From FIG. 7, it is learned that when the holding time is not less than 120 seconds, the number of pieces of foreign particle becomes not more than 10.

From the above measurement results, it is learned that when loading the substrate on the processing table, there are a large number of pieces of foreign particle when the difference in temperature between the substrate and processing table is large. Based on these measurement results, the present invention, as explained above, proposes the method of loading the substrate on the processing table after the temperature of the substrate sufficiently approaches the temperature of the processing table when the temperatures of the substrate carried into the vacuum-processing chamber and the processing table for loading it remarkably differ, and the apparatus for working the method.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Next, preferred embodiments of the present invention will be explained with reference to the attached drawings.

Figure 1:
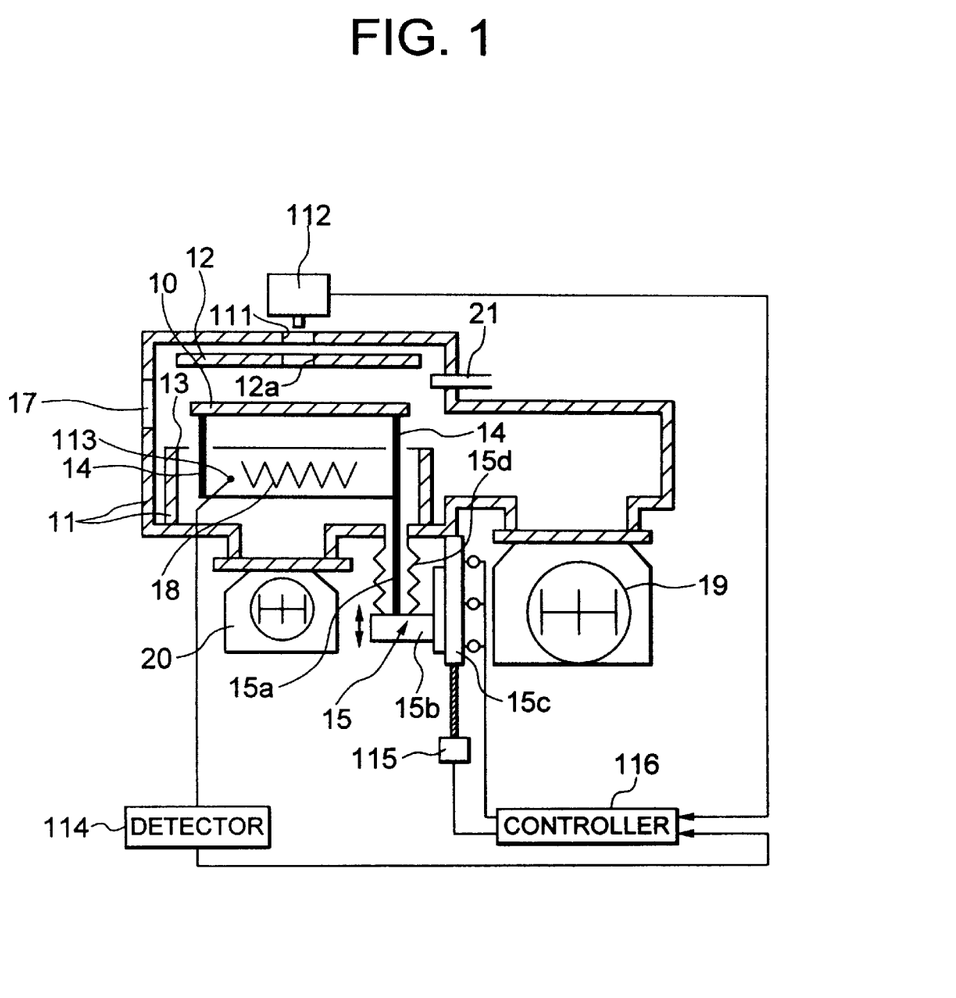
FIG. 1 is a view of the configuration for explaining a typical embodiment of a substrate loader according to the present invention.

FIG. 1 shows the configuration of an apparatus for loading a substrate (a substrate loader) according to the present invention. The basic configuration is the same as that of the semiconductor manufacturing apparatus explained with reference to FIG. 9 in the section on the related art. Therefore, in FIG. 1, parts substantially the same as the parts explained in FIG. 9 are assigned the same reference numerals and symbols.

The configuration of the semiconductor manufacturing apparatus will be explained in brief. The semiconductor manufacturing apparatus is a CVD apparatus using a cold-wall type vacuum-processing chamber heating only the substrate to be heated and is comprised of a cooling chamber 11, a heat reflecting plate 12, and a processing table 13 housing a heating source. The processing table 13 is provided with, for example, three lift pins 14 with a vertically movable structure. A lift pin drive mechanism 15 for raising and lowering the lift pins 14 and a controller 116 for controlling the operation of the lift pin drive mechanism 15 are provided. The lift pin drive mechanism 15 is comprised of a support 15a linked with the plurality of lift pins 14, a movable member 15b supporting the support 15a, and a drive member 15c raising and lowering the movable member 15b. The support 15a is provided passing through the bottom of the vacuum-processing chamber. The support 15a is covered by a bellows 15d so as to maintain the vacuum seal of the vacuum-processing chamber and deal with the operation of raising and lowering the support 15a. A substrate 10 is carried into the vacuum-processing chamber by a transport robot (not shown) through a transport gate 17 and is first placed on the lift pins 14 in the raised state. Next, the lift pins 14 are made to descend, whereby the substrate 10 is placed on the substrate-loading surface of the processing table 13. The processing table 13 houses a heater 18 and is heated to a fixed temperature of 600° C., for example.

The vacuum-processing chamber is provided with turbo molecular pumps 19 and 20 at the side-wall and bottom for evacuating the inside to a required vacuum state. The inside of the vacuum-processing chamber is divided into a top chamber positioned above the processing table 13 and a bottom chamber positioned below it. The turbo molecular pumps 19 and 20 are used to evacuate the top chamber and bottom chamber to the required pressure, respectively.

After the substrate 10 is placed on the substrate-loading surface of the processing table 13, a heat decomposing gas, Si$_2$H$_6$ gas, is introduced from a gas nozzle 21 at a rate of 12 sccm, for example. Due to this, a silicon film is deposited on the heated substrate 10. The temperature of the inside walls of the vacuum-processing chamber is adjusted by water circulating in the water-cooled chamber 11 to become about the water temperature.

The apparatus according to the present invention is characterized by moving the lift pins 14 (in particular making them descend) under the following predetermined control when loading the substrate 10 carried into the vacuum-processing chamber onto the heated processing table 13 by the lift pins 14. This control is performed based on commands of the controller 116. The controller 116 is for example a computer and is installed with a program for controlling the operation for raising and lowering the lift pins 14 through a lift pin drive mechanism 15. Further, if the operation for raising and lowering the lift pins is a simple one, it is possible to use an ordinary sequence control mechanism or programmable controller etc.

The controller 116 has to obtain information on the respective temperature conditions of the substrate 10 and the processing table 13 within the vacuum-processing chamber in order to perform the predetermined control. Therefore, a window 111 is provided in the ceiling of the vacuum-processing chamber and a radiant-energy thermometer (optical pyrometer etc.) 112 is provided at the outside. The radiant-energy thermometer 112 faces the substrate 10 through the window 111. Note that a hole 12a is formed in the heat reflecting plate 12 to enable the radiant-energy thermometer 112 to accurately detect the temperature of the substrate 10. On the other hand, a thermocouple 113 is provided inside the processing table 13. The content of detection at the thermocouple 113 is taken out as temperature information at the detector 114. Thus, the thermocouple 113 and the detector 114 comprise a different thermometer.

The signal relating to the substrate temperature output from the above radiant-energy thermometer 112 and the signal relating to the temperature of the processing table 13 output from the detector 114 are input to the controller 116. The controller 116 controls the operation of the motor 115 of the lift pin drive mechanism 15 and the drive member 15c by comparing the relative magnitudes of the temperature signals of the substrate 12 and the processing table 13, and raises or lowers the movable member 15b by a ball-screw mechanism and the like to load the substrate by the method explained below.

Figure 2:
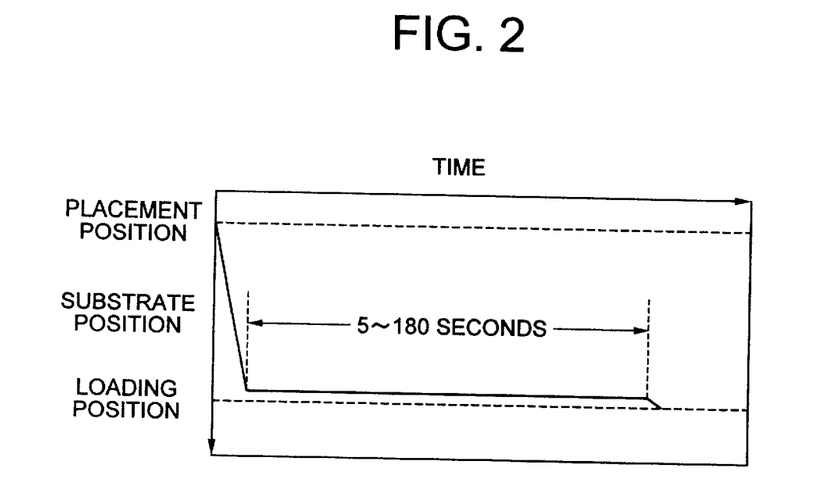
FIG. 2 is a view of a descent operation showing a first embodiment of a method of loading a substrate according to the present invention.

The present invention differs from the related art in the method of raising and lowering the lift pins 14. FIG. 2 shows a first embodiment of the method of loading a substrate according to the present invention. In the first embodiment, the substrate 10 placed on the lift pins 14 by the transport robot is loaded on the substrate-loading surface of the processing table 13 by the descent of the lift pins 14. At this time, as shown in FIG. 1, the descent operation is temporarily made to stop in the middle of the descent at a position where the substrate 10 is directly above the processing table 13. Here, the processing table 13 has the heater 18 inside it. The processing table 13 is heated and controlled so that its temperature becomes 600° C., for example. Since the configuration for controlling the temperature of the heater 18 is well known, the illustration of it will be omitted.

As explained above, the substrate 10 is temporarily stopped near the top of the processing table 13. The lift pins 14 are made to descend after the temperature of the substrate 10 sufficiently approaches the temperature of the processing table 13. Due to this, the substrate 10 is loaded on the processing table 13. That is, the substrate 10 is heated to 450° C. by the temporary stop when being loaded on the processing table 13. Therefore, the temperature difference between the substrate 10 and the processing table 13 becomes equal to or less than 150° C. At this time, the in-plane variation of temperature of the substrate 10 is within 2° C. The temperature conditions required for the predetermined processing are sufficiently satisfied.

In the case of the above first embodiment, the substrate 10 is preferably loaded on the processing table 13 after stopping it for 120 seconds at a position 3 mm above the processing table 13. Note that generally the position for temporarily stopping the substrate 10 is in a range of 1 to 50 mm above the processing table 13. The time required for temporarily stopping the lift pins 14, when the substrate 10 is a silicon bare substrate (a silicon substrate before processing), is preferably in a range of 60 to 180 seconds. When the substrate 10 is an actual device substrate (a substrate other than the silicon substrate or a processed silicon substrate), the time required for temporarily stopping the lift pins is preferably in a range of 1 to 180 seconds.

Figure 3:
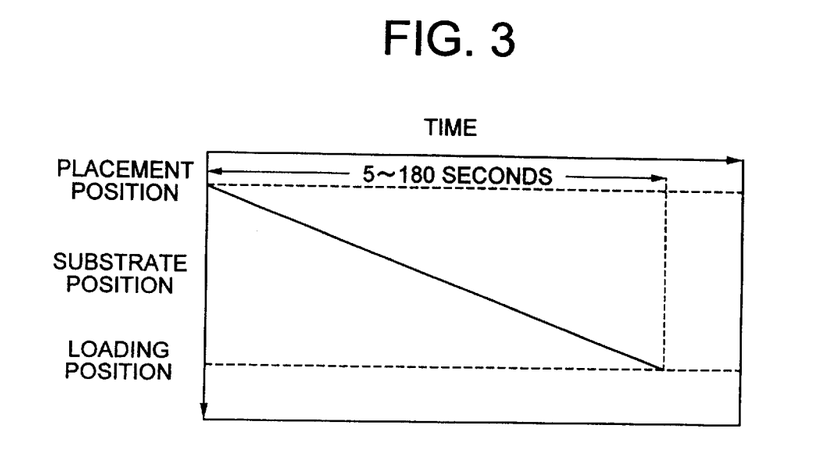
FIG. 3 is a view of a descent operation showing a second embodiment of a method of loading a substrate according to the present invention.
Figure 8:
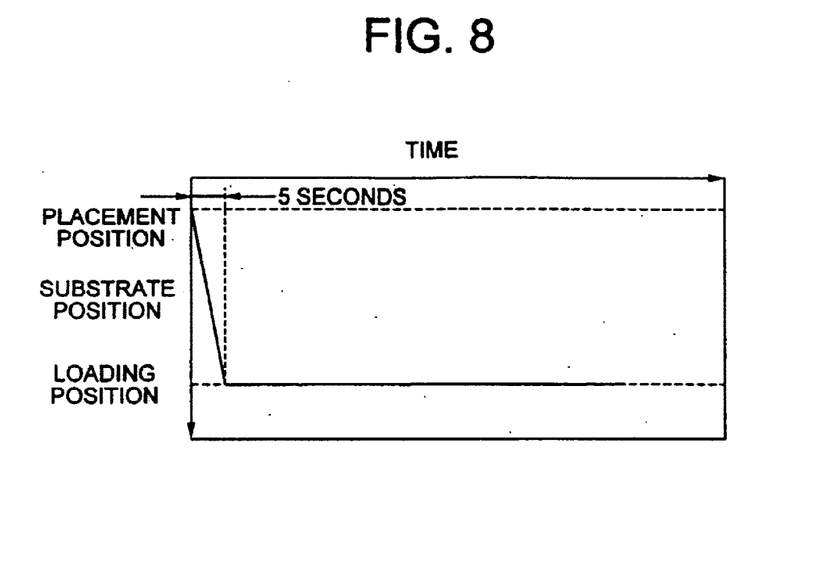
FIG. 8 is a view of a descent operation of a substrate by the conventional method of loading a substrate.

Next, a second embodiment of the method of loading a substrate according to the present invention will be explained in accordance with FIG. 3. According to the second embodiment, the substrate 10 placed on the lift pins 14 approaches the processing table 13 at a fixed descending speed. It approaches from the placement position to the loading position in a time range of 60 to 180 seconds (in case of the silicon bare substrate), and preferably 120 seconds. On the other hand, the descent rate of the conventional method of loading a substrate as shown in FIG. 8 was a fixed rate and the time necessary for the descent from the placement position to the loading position was about 5 seconds. In the method of descent according to the second embodiment as well, in the same way as the first embodiment, the temperature of the substrate 10 rises to 450° C. at the time of loading on the processing table 13. Further, the in-plane variation of the temperature of the substrate 10 is within 2° C. and the temperature conditions required for the predetermined processing are sufficiently satisfied. Further, since the sufficient long time is taken for the descent operation, it is possible to make the change of temperature of the substrate 10 slow and make the change of heat expansion of it slow.

Figure 4:
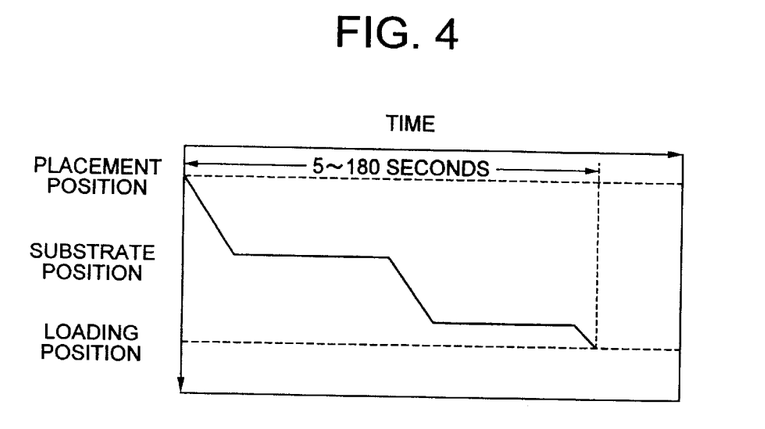
FIG. 4 is a view of a descent operation showing a third embodiment of a method of loading a substrate according to the present invention.

FIG. 4 shows a third embodiment of the method of loading a substrate according to the present invention. In the third embodiment, the descent operation of the lift pins 14 is divided into three stages, for example. By bringing the substrate 10 close to the processing table 13 in stages in this way, the temperature of the substrate 10 is gradually raised. When the substrate 10 is placed on the substrate-loading surface of the processing table 13, it has been heated to 450° C. In the present embodiment, the in-plane variation is less than 2° C. The temperature conditions required for the predetermined processing are sufficiently satisfied. Further, since the descent operation of the substrate 10 is divided into at least two stages, it is possible to slow the change in temperature of the substrate 10 and possible to slow the change in heat expansion of the substrate 10. In this embodiment as well, the time for descent from the placement position to the loading position is made 60 to 180 seconds (in case of the silicon bare substrate, for example), preferably close to 120 seconds.

In each of the above embodiments, the method of lowering the substrate is set so that the temperature difference of the substrate 10 and the processing table 13 becomes within 150° C. when the substrate 10 is loaded on the substrate-loading surface of the processing table 13. That is, at the stage before the substrate 10 is loaded on the processing table 13, when the substrate 10 descends, the descent operation is controlled so that sufficient time is allowed to elapse so that the temperature difference between the processing table 13 and the substrate 10 at the time of loading the substrate 10 becomes less than 150° C. According to this, the expansion of the substrate 10 on the processing table 13 can be kept to 200 (mm)×4.1×10$^{-6}$ (1/° C.)×150 (° C.)=0.12 (mm). Therefore, it is possible to greatly reduce the sliding motion due to the heat expansion of the substrate 10.

FIG. 5 shows the results of measurement (B) when working the method of loading a substrate according to the present invention. According to the measurement results (B), even when for example 8000 substrates have finished being processed, the number of instances of foreign particle can be maintained at not more than 10. This reason is as follows. In comparison with the sharp change in substrate temperature 10 from 25° C. to 600° C. at the time of loading and the expansion by 0.47 mm in case of the conventional method of loading a substrate, there is only a temperature change of 450° C. to 600° C. in the substrate 10 at the time of loading in case of the embodiments of the present invention. Therefore, according to the embodiments, the heat expansion can be kept to 0.12 mm and it is possible to greatly reduce the sliding motion of the substrate 10 due to heat expansion on the substrate-loading surface of the processing table 13.

In the above embodiments, the explanation was made with reference to the silicon bare substrate. When actually producing a semiconductor device, however, a silicon substrate on which various materials are deposited in advance is used. Therefore, the temperature rise characteristics of the substrates are expected to be different. Accordingly, it is effective to find the above temperature difference (dT). It is important to find the dT and load the substrate on the processing table when the dT is not more than 150° C. The invention is not necessarily limited to the times explained in the above-mentioned embodiments. The method and apparatus for loading a substrate according to the present invention are self-evident to be effective even when the substrate is other than silicon, for example, germanium (Ge), gallium arsenic (GaAs), or quartz glass, and even when the deposited film is other than silicon (Si), for example, an SiGe alloy, GE, GaAs or other compound semiconductor, metal, or insulator. Further, according to the present invention, self-evidently a similar effect is given even in the case of a substrate processing apparatus provided with a cooling mechanism for cooling the substrate.

Each of the above-mentioned embodiments explains the case where the processing table is heated and the processed substrate is relatively low in temperature. However, the method of loading a substrate of the present invention can also be applied to a case where the processing table is cooled (low temperature state) and the processed substrate is relatively high in temperature. As an example of this type, the temperature of the processing table may be 0° C. and the temperature of the processed substrate may be 200° C.

According to the present invention, in the method of loading the substrate on the processing table in the semiconductor manufacturing apparatus provided with the heated or cooled processing table, the substrate is loaded on the processing table after the temperature of the substrate sufficiently approaches the temperature of the processing table. Therefore, even when film or products are deposited on the substrate-loading surface of the processing table, these will not peel off and the substrates can be processed in a similar time as in the conventional art. It is therefore possible to achieve both a reduction of the deposition of foreign particle causing defects in the substrates and an improvement of the productivity. Further, since the deposition of foreign particle causing substrate defects can be reduced, it is possible to extend the cleaning cycle of the processing chamber. The extension of the cleaning cycle enables an improvement in the operating rate of the apparatus, a reduction of the costs of parts and labor and consequently reduced manufacturing cost and an improvement in the productivity.

While the invention has been described with reference to specific embodiment chosen for purpose of illustration, it should be apparent that numerous modifications could be made thereto by those skilled in the art without departing from the basic concept and scope of the invention.

What is claimed is:

1. A method of loading a substrate in a semiconductor manufacturing apparatus for applying predetermined processing to the substrate, in which the substrate is carried into a vacuum-processing chamber and loaded on a heated or cooled table, comprising;

taking a sufficient time to lower the substrate toward said table when loading the substrate on said table so that a temperature difference between said table and the substrate at the time of loading the substrate becomes less than 150° C.

2. A method of loading a substrate in a semiconductor manufacturing apparatus as set forth in claim 1, further comprising temporarily stopping said substrate during its descent.

3. A method of loading a substrate in a semiconductor manufacturing apparatus as set forth in claim 2, wherein the position for temporarily stopping the substrate is in the range of 1 to 50 mm above said table.

4. A method of loading a substrate in a semiconductor manufacturing apparatus as set forth in claim 1, wherein the substrate is lowered at a fixed rate of descent and a descent time is in the range of 1 to 360 seconds.

5. A method of loading a substrate in a semiconductor manufacturing apparatus as set forth in claim 4, wherein the descent time is in the range of 60 to 180 seconds when the substrate is a silicon substrate before processing.

6. A method of loading a substrate in a semiconductor manufacturing apparatus as set forth in claim 4, wherein the descent time is in the range of 1 to 180 seconds when the substrate is an actual device substrate.

7. A method of loading a substrate in a semiconductor manufacturing apparatus for applying predetermined processing to the substrate, in which the substrate is carried into a vacuum-processing chamber and loaded on a heated or cooled table, and which is provided with lift pins for loading the substrate on said table and a drive mechanism for raising and lowering said lift pins, comprising;

placing the substrate carried into said vacuum-processing chamber by a transport robot on to said lift pins moved to an ascended position, taking a sufficient time for lowering said lift pins so that a temperature difference between said table and the substrate at the time of loading the substrate on said table becomes less than 150° C., and loading the substrate on said table afterward.

8. A method of loading a substrate in a semiconductor manufacturing apparatus as set forth in claim 7, further comprising temporarily stopping the substrate during its descent.

9. A method of loading a substrate in a semiconductor manufacturing apparatus as set forth in claim 8, wherein the position for temporarily stopping the substrate is in the range of 1 to 50 mm above said table.

10. A method of loading a substrate in a semiconductor manufacturing apparatus as set forth in claim 8, wherein the operation for lowering the lift pins is divided into at least two stages.

11. A method of loading a substrate in a semiconductor manufacturing apparatus as set forth in wherein the substrate is lowered at a fixed rate of descent and a descent time is in the range of 1 to 360 seconds.

12. A method of loading a substrate in a semiconductor manufacturing apparatus as set forth in claim 11, wherein the descent time is in the range of 60 to 180 seconds when the substrate is a silicon substrate before processing.

13. A method of loading a substrate in a semiconductor manufacturing apparatus as set forth in claim 11, wherein the descent time is in the range of 1 to 180 seconds when the substrate is an actual device substrate.

14. An apparatus device for loading a substrate in a semiconductor manufacturing apparatus in which the substrate is carried into a vacuum-processing chamber and loaded on a heated or cooled table placed in said chamber, and applied with a predetermined processing, and is provided with lift pins for loading the substrate on said table and a drive mechanism for raising and lowering said lift pins, comprising;

a first thermometer for measuring a temperature of the substrate, a second thermometer for measuring a temperature of the table, and a controller for receiving signals output by said first thermometer and second thermometer, and controlling the operation of said drive mechanism, based on the temperature information of the substrate and table, so as to cause sufficient time to elapse when lowering said lift pins so that a temperature difference between said table and the substrate at the time of loading the substrate becomes less than a predetermined temperature, and then load the substrate on said table.

15. An apparatus for loading a substrate in a semiconductor manufacturing apparatus as set forth in claim 14, wherein the predetermined temperature is 150° C. when said table is heated.

* * * * *